United States Patent
Saggio et al.

(10) Patent No.: US 8,012,832 B2
(45) Date of Patent: Sep. 6, 2011

(54) PROCESS FOR MANUFACTURING A MULTI-DRAIN ELECTRONIC POWER DEVICE INTEGRATED IN SEMICONDUCTOR SUBSTRATE AND CORRESPONDING DEVICE

(75) Inventors: Mario Giuseppe Saggio, Acicastello (IT); Ferruccio Frisina, Sant'Agata li Battiati (IT); Simone Rascuna, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/971,163

(22) Filed: Jan. 8, 2008

(65) Prior Publication Data

US 2008/0224204 A1 Sep. 18, 2008

Related U.S. Application Data

(63) Continuation-in-part of application No. PCT/EP2006/006673, filed on Jul. 7, 2006.

(30) Foreign Application Priority Data

Jul. 8, 2005 (EP) .................................. 05425494

(51) Int. Cl.
*H01L 21/336* (2006.01)
*H01L 29/66* (2006.01)
(52) U.S. Cl. ............... 438/268; 257/342; 257/E21.418; 257/E29.257
(58) Field of Classification Search .................. 438/268; 257/E21.418, E29.257, 328, 335, 337, 339, 257/341, 342
See application file for complete search history.

(56) References Cited

U.S. PATENT DOCUMENTS

| | | | |
|---|---|---|---|
| 5,216,275 A | 6/1993 | Chen | |
| 6,300,171 B1 | 10/2001 | Frisina | |
| 6,551,909 B1 * | 4/2003 | Fujihira | 438/510 |
| 6,586,798 B1 | 7/2003 | Frisina | |
| 6,724,042 B2 * | 4/2004 | Onishi et al. | 257/341 |
| 2001/0028083 A1 | 10/2001 | Onishi et al. | |
| 2001/0053589 A1 | 12/2001 | Frisina | |
| 2002/0014671 A1 | 2/2002 | Saggio et al. | |
| 2003/0011039 A1 | 1/2003 | Ahlers et al. | |
| 2003/0207536 A1 | 11/2003 | Miyasaka et al. | |

OTHER PUBLICATIONS

Shenoy, P. et al., "Analysis of the Effect of Charge Imbalance on the Static and Dynamic Characteristics of the Super Junction MOSFET," The 11th International Symposium on Power Semiconductor Devices and IC's, Toronto, Ontario, Canada, May 26-28, 1999, pp. 99-102.

* cited by examiner

*Primary Examiner* — Matthew C Landau
*Assistant Examiner* — Jessica Hall
(74) *Attorney, Agent, or Firm* — Lisa K. Jorgenson; Robert Iannucci; Seed IP Law Group PLLC

(57) ABSTRACT

A process manufactures a multi-drain power electronic device integrated on a semiconductor substrate of a first type of conductivity whereon a drain semiconductor layer is formed. The process includes: forming a first semiconductor epitaxial layer of the first type of conductivity of a first value of resistivity forming the drain epitaxial layer on the semiconductor substrate, forming first sub-regions of a second type of conductivity by a first selective implant step with a first implant dose, forming second sub-regions of the first type of conductivity by a second implant step with a second implant dose, and forming a surface semiconductor layer. The process also includes forming body regions of the second type of conductivity aligned with the first sub-regions, and carrying out a thermal diffusion process so that the first sub-regions form a single electrically continuous column region aligned and in electric contact with the body regions.

24 Claims, 8 Drawing Sheets

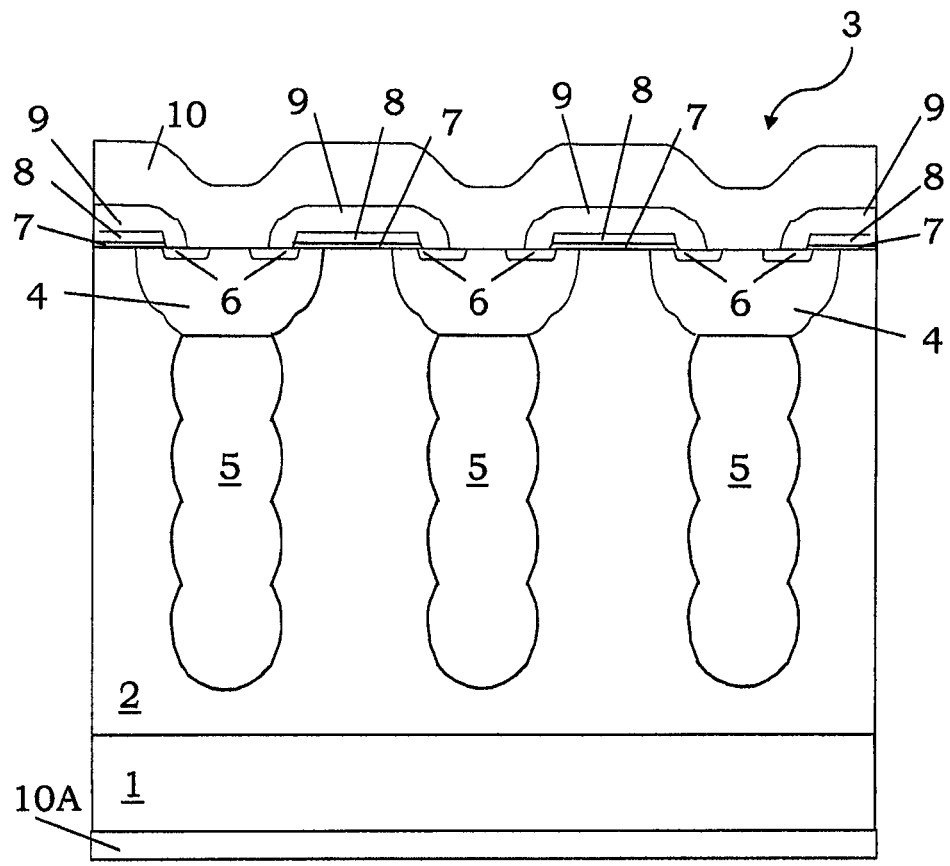
FIG. 1
*(Prior Art)*
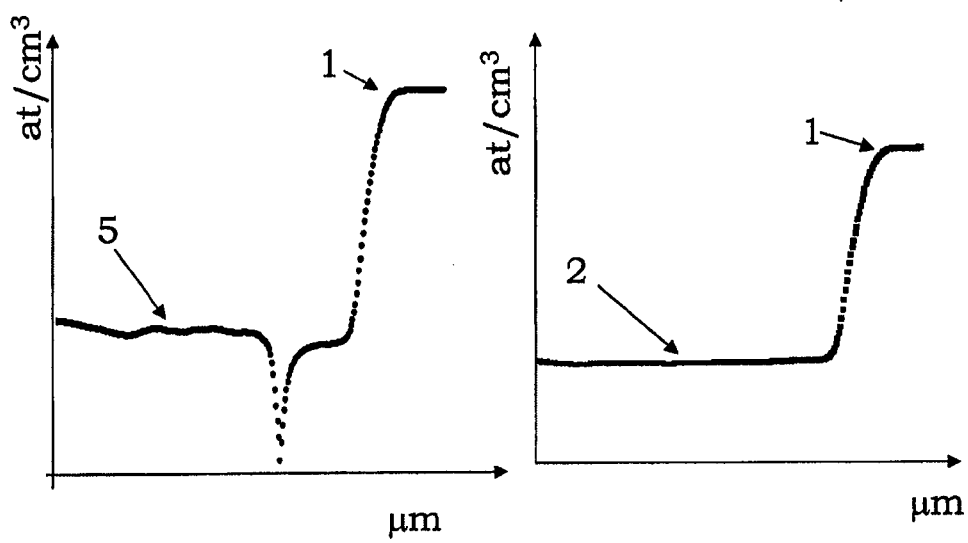
FIG. 2
*(Prior Art)*
FIG. 3
*(Prior Art)*

PROCESS FOR MANUFACTURING A MULTI-DRAIN ELECTRONIC POWER DEVICE INTEGRATED IN SEMICONDUCTOR SUBSTRATE AND CORRESPONDING DEVICE

BACKGROUND

1. Technical Field

The present invention relates to a process for manufacturing a multi-drain power electronic device integrated on a semiconductor substrate.

More specifically, the invention relates to a process for manufacturing a multi-drain power electronic device integrated on a semiconductor substrate of a first type of conductivity whereon a drain semiconductor layer is formed.

The invention particularly, but not exclusively, relates to a process for manufacturing a multi-drain power MOS transistor and the following description is made with reference to this field of application by way of illustration only.

2. Description of the Related Art

As it is well known, power MOS devices with a breakdown voltage BV comprised between 200 and 1000V have a high output resistance (Ron) mainly due to the epitaxial drain layer resistance which is used to withstand high voltages, and it depends on the dopant concentration of the epitaxial layer itself.

However, the possibility is also known of obtaining power MOS devices with a low output resistance and a high breakdown voltage BV by modifying the epitaxial layer concentration.

A known MOS device meeting this need is shown in FIG. 1, globally indicated with 3. Such a MOS power device 3 is of the so called multi-drain type and it comprises a heavily doped semiconductor substrate 1, in particular of the N+ type, whereon a semiconductor epitaxial layer 2 of the same type of N is formed.

The epitaxial layer 2 forms a drain layer common by a plurality of elementary units forming the MOS power device 3. Each elementary unit comprises a body region 4, in particular of the P type, formed on the epitaxial layer 2.

In the epitaxial layer 2, below each body region 4, there is a column region 5, in particular of the P type, which extends downwards for substantially the whole thickness of the epitaxial layer 2 towards the semiconductor substrate 1.

In particular, each column region 5 is aligned and in contact with a respective body region 4 of an elementary unit of the MOS power device 3.

In such way, as shown in FIG. 2, wherein the concentration of the epitaxial layer is shown as a function of its thickness, the N epitaxial layer 2 of the MOS power device 3 thus formed has a constant resistivity. Also the column regions 5 have a constant concentration along their whole column extension, as shown in FIG. 3, wherein the concentration of the column regions 5 is shown as a function of their thickness.

The MOS power device 3 also exhibits, inside the body regions 4, heavily doped source regions 6, in particular of the N type.

The surface of the epitaxial layer 2 is thus covered with a thin gate oxide layer 7 and with a polysilicon layer. Openings are provided in the polysilicon layer 8 and in the thin gate oxide layer 7 to uncover portions of the epitaxial layer 2 surface in correspondence with each source region 6. An insulating layer 9 completely covers the polysilicon layer 8 and it partially covers the source regions 6, so as to enable a source metallic layer 10 to contact the source regions 6 and the body regions 4. A drain metallic layer 10A is also provided on the lower surface of the semiconductor substrate 1.

It is to be noted that the presence of the column regions 5 thus allows to reduce the resistivity of the epitaxial layer 2 without decreasing the breakdown voltage BV of the MOS power device 3 as a whole. With this type of devices it is thus possible to reach a predetermined breakdown voltage BV with a resistivity of the epitaxial layer 2 being lower than that used in conventional MOS devices and, in consequence, to obtain power MOS transistors with reduced output resistance.

Moreover, as shown in FIG. 4, MOS power devices formed by means of a plurality of elementary units comprising column regions 5 exhibit an output resistance, shown by curve A, being breakdown voltage BV equal, lower not only than the one, shown by curve B, of conventional MOS devices but also lower than the so called ideal limit of silicon, shown by curve C.

To better understand the dynamics of these known devices, with reference to FIGS. 6 to 10, a method is now described for forming the multi-drain MOS power device 3 of FIG. 1.

In particular, on the heavily doped semiconductor substrate 1 of the N+ type an epitaxial layer 2 is formed comprising, on the bottom, a first epitaxial layer 2a of the N type with a dopant concentration corresponding to a resistivity $\rho$.

After having formed a first photolithographic mask on the first epitaxial layer 2a, a trench in this first epitaxial layer 2a through the first photolithographic mask for forming a zero level indicator not shown in the figures.

A second mask is thus formed on such first epitaxial layer 2a wherein a plurality of openings are formed.

Through these openings a first implant step of P dopant is carried out for forming first implanted regions 5a, as shown in FIG. 6.

As shown in FIG. 7, on the first epitaxial layer 2a a second N epitaxial layer 2b is formed with a dopant concentration corresponding to the resistivity $\rho$.

A third mask is then formed, aligned with the second mask by means of the zero level indicator, on the second epitaxial layer 2b wherein a plurality of openings are formed.

Through these openings a second P dopant implant step is carried out in the second epitaxial layer 2b for forming second implanted regions 5b.

As shown in FIG. 8, on the second epitaxial layer 2b, a third epitaxial layer 2c of the N type is then formed having a dopant concentration corresponding to the resistivity $\rho$.

A fourth mask is then formed, aligned with the second and the third mask by means of the zero level indicator on the third epitaxial layer 2c wherein a plurality of openings are formed.

Through these openings a third P dopant implant step is carried out in the third epitaxial layer 2c for forming, by means of a subsequent thermal diffusion process, third implanted regions 5c.

As shown in FIG. 9, on the third epitaxial layer 2c, the fourth N epitaxial layer 2d is then formed having a dopant concentration always corresponding to the resistivity $\rho$.

A fifth mask is then formed, aligned with the second, third and fourth mask by means of the zero level indicator on the fourth epitaxial layer 2d wherein a plurality of openings are formed.

Through these openings a fourth P dopant implant step is carried out in the fourth epitaxial layer 2d for forming fourth implanted regions 5d.

Obviously, it is possible to provide any number of masking steps and subsequent dopant implantation for forming a plurality of implanted regions aligned and arranged in a succession of epitaxial layers overlapped onto each other.

As shown in FIG. 10, as last on the fourth epitaxial layer 2d, a fifth N epitaxial layer 2e is then formed having a fifth dopant concentration always corresponding with the resistivity ρ.

A sixth mask is then formed, aligned with the second, third, fourth and fifth mask by means of the zero level indicator on the fifth epitaxial layer 2e wherein a plurality of openings are formed.

Through these openings a fifth P dopant implant step is carried out in the fifth epitaxial layer 2e for forming the body regions 4 of the MOS power device 3, as previously shown with reference to FIG. 1.

A seventh mask is then formed, aligned with the second, third, fourth, fifth and sixth mask by means of the zero level indicator on the fifth epitaxial layer 2e wherein a plurality of openings are formed.

Through these openings a sixth N+ dopant implant step is carried out in the fifth epitaxial layer 2e for forming the source regions 6 of the MOS power device 3.

A thermal process of thermal diffusion is then carried out for diffusing the implanted regions 5a, 5b, 5c, 5d, the body regions 4 and the source regions 6 of the MOS power device 3 and so that the implanted regions 5a, 5b, 5c, 5d form a single column region 5 aligned and in contact with the body region 4.

In particular, as shown in FIG. 1, after the diffusion process of the implanted regions 5a, 5b, 5c, 5d, each column region 5 shows itself as a column structure comprising "spherical bubbles" of the P type.

The process is then completed with the conventional manufacturing steps including the formation of the thin gate oxide layer 7 and the polysilicon layer 8 on the surface of the epitaxial layer 2. Openings are then provided in the polysilicon layer 8 and in the thin gate oxide layer 7 until they uncover portions of the surface of the epitaxial layer 2 aligned with each source region 6. The insulating layer 9 is formed until it completely covers the polysilicon layer 8 and it partially covers the source regions 6, so as to allow a source metallic layer 10 formed on the MOS power device 3 to contact the source regions 6 and the body regions 4. A drain metallic layer 10A is finally formed on the lower substrate of the semiconductor substrate 1.

It is to be noted that the presence of the column regions 5 hooked to the body regions 4 empties the drain region 2, enabling the MOS power device 3 thus formed to withstand a predetermined voltage applied from the outside to the device even when there are dopant high concentrations in the epitaxial layer 2 (which is a conductive layer of the N type, in the case of devices with channel N like the one shown with reference to FIGS. 1 and 6-10).

Moreover, the breakdown voltage BV, that the MOS power device 3 thus obtained can withstand, varies, the resistivity in the epitaxial layer 2 being equal, with the dopant concentration in the column regions 5 (which are, in the example shown in FIGS. 1 and 6-10, of the P type).

In particular, as shown in FIG. 4a, the breakdown voltage BV varies when the P dopant concentration in the drain epitaxial layer 2 increases: in particular, the breakdown voltage is maximum when the N dopant concentration in the drain epitaxial layer 2 is completely balanced by the P dopant concentration introduced by a P implant dose $\Phi_E$ used to form the column regions 5. This condition is indicated as "charge balance".

If during the first P dopant implant step for forming first implanted regions 5a an implant dose $\Phi$ is used being lower than the implant dose $\Phi_E$, the final concentration of the column regions 5 is lower than the concentration of the column regions 5 obtained by means of the implant dose $\Phi_E$ used in the case of "charge balance". This condition is indicated as "ρ charge fault" or, equivalently, "n charge excess". If during the first P dopant implant step for forming first implanted regions 5a an implant dose $\Phi$ is used being higher than the implant dose $\Phi_E$, the concentration of the column regions 5 is higher than the concentration of the column regions 5a obtained in the case of "charge balance". This condition is indicated as "ρ charge excess" or, equivalently, "n charge fault".

As it has been said, under both the described charge excess/fault conditions, the breakdown voltage BV of the devices obtained is lower than the one obtained by using the implant dose $\Phi_E$.

Then, for realizing the charge balance conditions balancing the charge N obtained epitaxially with the implanted charge P is necessary.

However, the layers formed by epitaxy exhibit values of a predetermined design quantity, such as for example the thickness or the resistivity of the layer, which vary from layer to layer and inside the same layer. Moreover, such values are different from those of the layers formed by means of implantation.

Since in the devices of the Multi Drain type to obtain the highest breakdown voltage BV it is necessary to balance and control the charge introduced by epitaxy, for example of the N type and the one introduced by implantation for example of the P type, the different values of the predetermined design quantities inside the single layers formed by epitaxy or by implantation are statistically a cause of the device failure, i.e., the predetermined design breakdown voltage BV is not reached and thus the productive yield of the final device is decreased.

Moreover, in multi-drain devices, the resistivity of the epitaxial layer 2 fixes the distance between two adjacent column regions 5 and thus the pitch of the entire MOS power device 3 thus formed.

In particular, by decreasing the resistivity of the epitaxial layer 2 and thus increasing the concentration of this layer it is necessary to form devices 3 with reduced (lateral) dimensions, so as to ensure a good resistance of the electric field in operation. To obtain these conditions it is thus necessary to reduce the thickness of the drain layer. However, by using reduced thickness for the drain epitaxial layer 2 to obtain MOS power devices which can withstand a predetermined voltage equal to the one which can be obtained with devices formed with greater thermal budgets and pitches, it is necessary to increase the number of the epitaxial layers forming the drain epitaxial layer and relative implant steps forming the P column regions 5.

This solution remarkably increases the manufacturing costs of the MOS power devices 3 thus formed.

In fact, the breakdown voltage BV the device 3 must be able to withstand defines the height of the column regions 5: for a device of 500 V it is comprised between 20 and 30 μm.

BRIEF SUMMARY

One embodiment is a process for manufacturing a multi-drain power electronic device integrated on a semiconductor substrate, having such structural characteristics as to allow to obtain devices with low output resistances and contained dimensions overcoming the limits still affecting the devices formed according to the prior art.

One embodiment manufactures a multi-drain power electronic device integrated on a semiconductor substrate comprising P column regions made of elliptical portions. In such way the column regions exhibit a reduced lateral extension.

The characteristics and the advantages of a process and of a device according to the invention will be apparent from the following description of an embodiment thereof given by way of indicative and non-limiting example with reference to the annexed drawings.

BRIEF DESCRIPTION OF THE SEVERAL VIEWS OF THE DRAWINGS

In such drawings:

FIG. 1 is a section view of a multi-drain power MOS transistor of the known type, FIGS. 2 and 3 respectively show a concentration profile of the N drain epitaxial layer and of the P column region for the multi-drain MOS power transistor of FIG. 1.

DETAILED DESCRIPTION

With reference to such figures, a process is described for manufacturing a multi-drain power electronic device integrated on a semiconductor substrate.

The process steps described hereafter do not form a complete process flow for the manufacturing of integrated circuits. The present invention can be put into practice together with the manufacturing techniques of the integrated circuits currently used in the field and, in the description, only those process steps being commonly used are included which are necessary for the comprehension of the present invention.

The figures showing cross sections of portions of an integrated electronic device during the manufacturing are not drawn to scale, but they are instead drawn so as to show important characteristics of various embodiments.

With reference to FIGS. 11 to 14 a first embodiment is now described of a process for manufacturing, in particular, a multi-drain MOS device 30.

Figure 4:
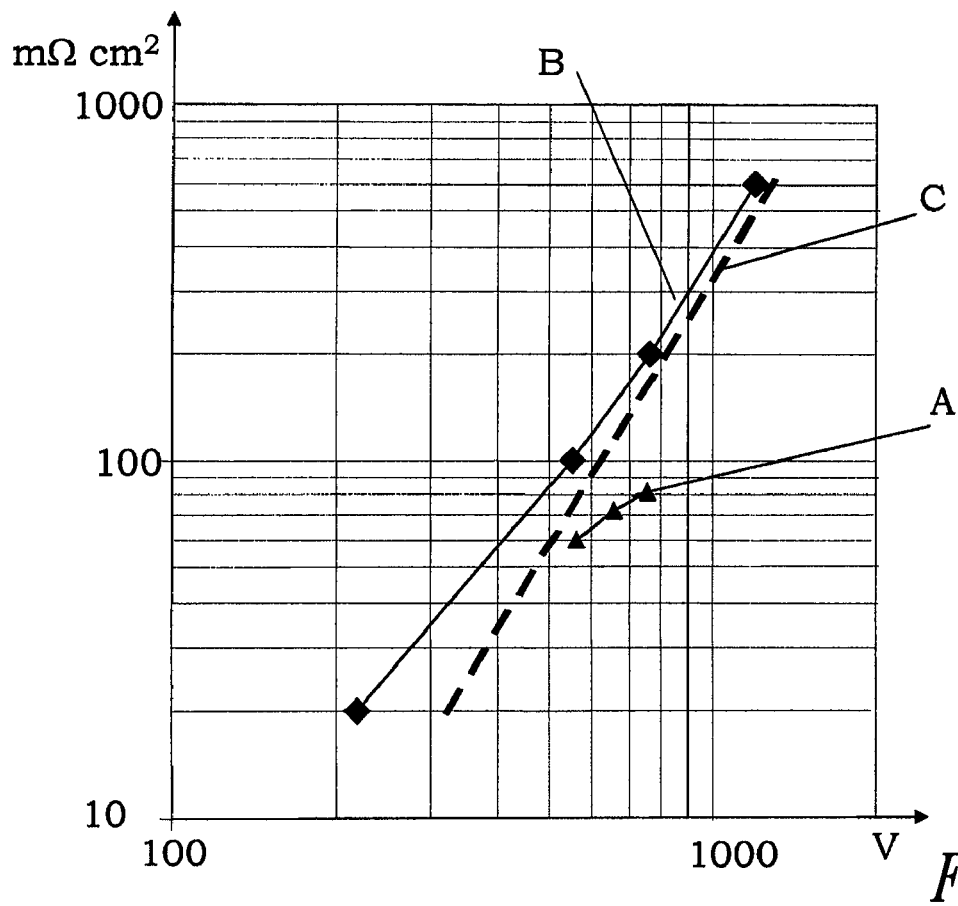
FIG. 4 shows the trend of the output resistance for area when the breakdown voltage BV for multi-drain MOS power devices, curve A, for conventional MOS power devices, curve B, and for the ideal limit in the silicon, curve C, varies.
Figure 5:
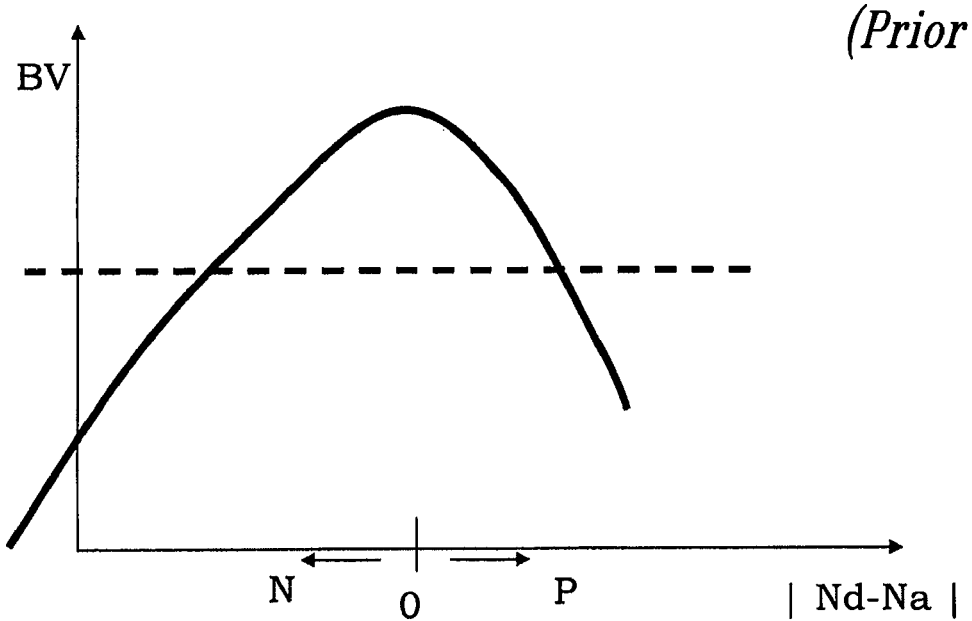
FIG. 5 shows the trend of the breakdown voltage BV when the charge balance conditions vary in the drain of multi-drain power MOS devices of the known type.
Figure 6:
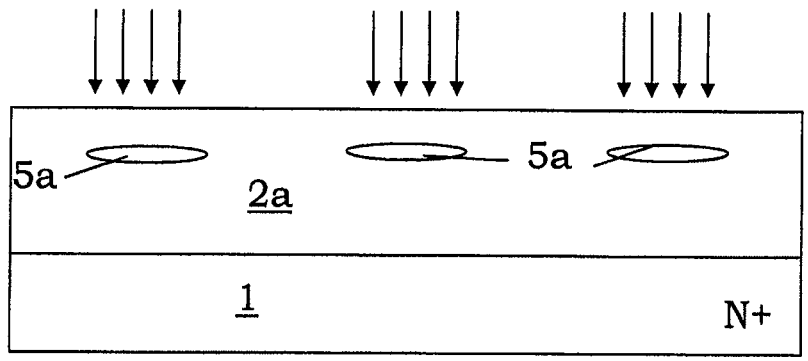
FIGS. 6 to 10 show vertical section views of the multi-drain power device of FIG. 1 during some steps of the manufacturing process.
Figure 7:
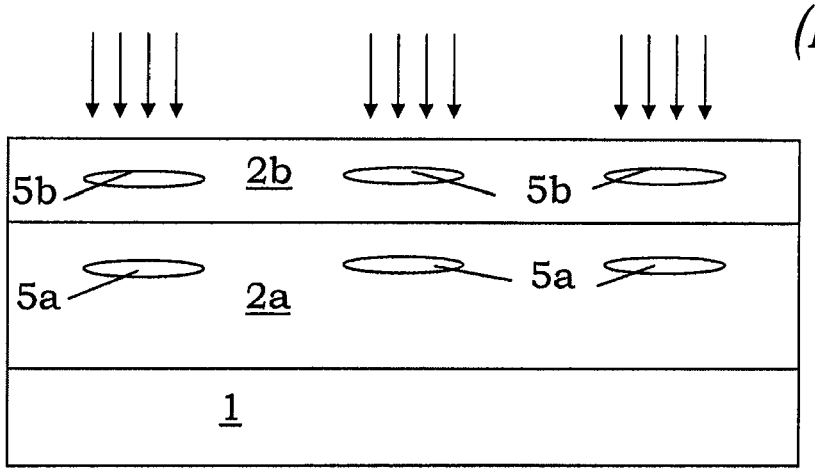
Figure 8:
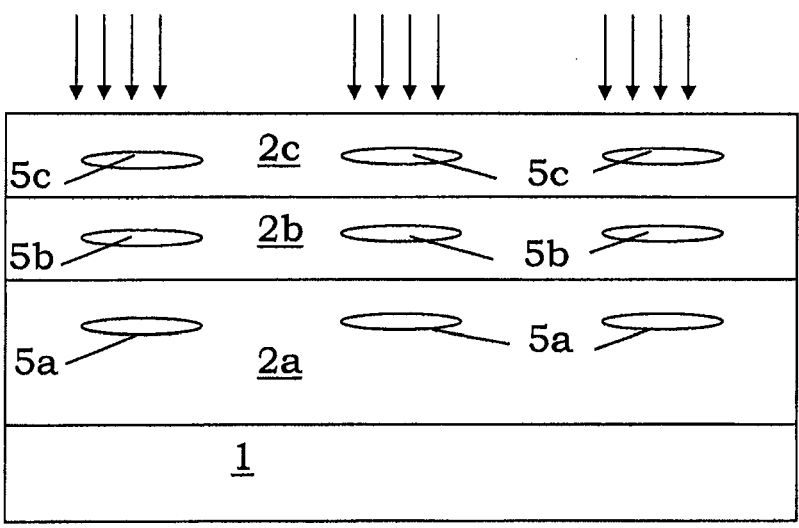
Figure 9:
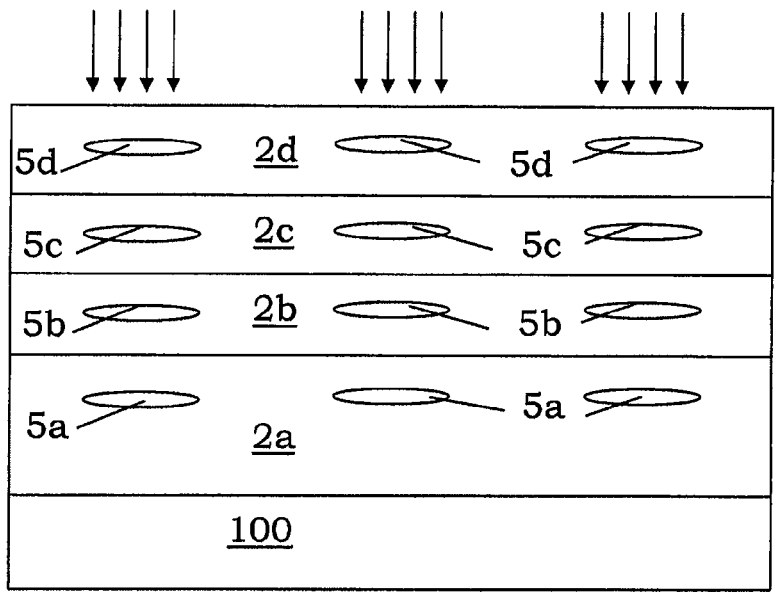
Figure 10:
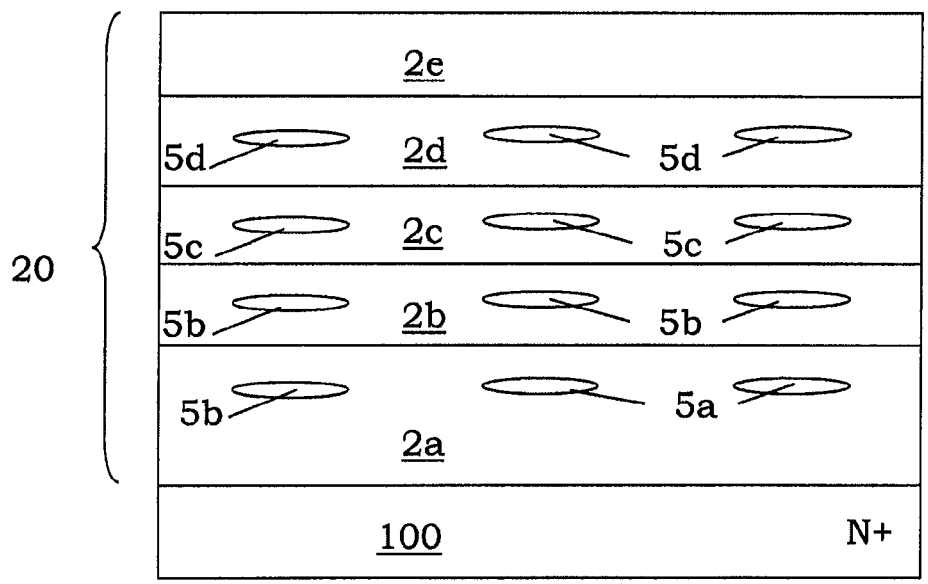
Figure 11:
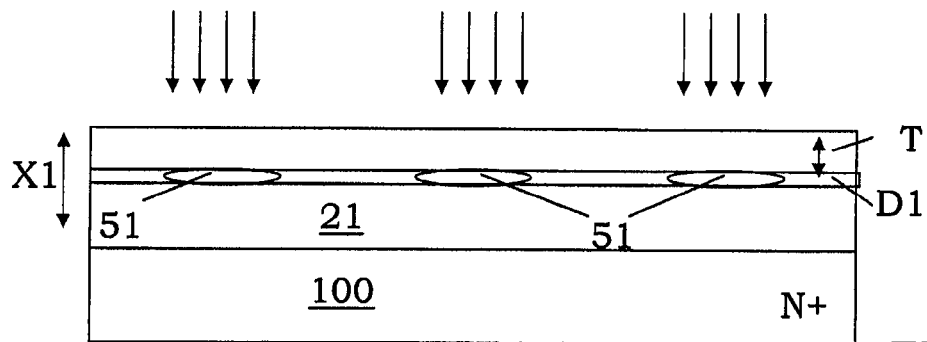
FIGS. 11 to 14 show vertical section views of a multi-drain power device during some manufacturing steps of a first embodiment.

As shown in FIG. 11, on a semiconductor substrate 100, for example of the N+ type, a drain semiconductor layer 20 is formed comprising a first semiconductor layer 21 of the N type with a resistivity $\rho_1$ comprised, for example, between 3 and 20 ohm*cm and a thickness X1 comprised, for example, between 2 and 20 μm and formed, for example, by epitaxial growth on the semiconductor substrate 100.

Advantageously, after having formed a first photolithographic mask on the first semiconductor layer 21, a trench is formed in this first semiconductor layer 21 through the first photolithographic mask for forming a zero level indicator not shown in the figures.

Once the first mask is removed, on the whole first semiconductor layer 21, a first N dopant implant step is carried out, to form a first N implanted region D1.

On the first semiconductor layer 21, a second mask is then formed wherein a plurality of openings are formed. Through these openings a first P dopant selective implant step is carried out for forming, by means of a successive diffusion process, first P implanted sub-regions 51.

Advantageously, these first implant steps have the same projected range, i.e., both the P dopant ions and the N ones are implanted in the first semiconductor layer 21 at the same depth T from the surface of the first semiconductor layer 21.

Advantageously, the first P dopant selective implant step is carried out with a first implant dose $\Phi_{1P}$ which is chosen so as to balance the concentration of dopant introduced through the first N dopant implant step carried out with a first dose $\Phi_{1N}$. The first P implant dose $\Phi_{1P}$ is for example comprised between $1.5 \times 10^{12}$ and $1.5 \times 10^{14}$ at/cm², the first N implant dose $\Phi_{1N}$ is for example comprised between $5.0 \times 10^{11}$ and $1.0 \times 10^{14}$ at/cm² while the implant energy used is, for example, comprised between 200 and 800 keV.

As already highlighted with reference to the prior art, when inside the drain semiconductor layer 20 a charge balance condition is realized, the highest breakdown voltage BV is obtained.

Advantageously, the charge balance obtained in the drain semiconductor layer 20 is obtained with dopants of the P type and of the N type which are both implanted. Thus, with the process described, a better productive efficiency is possible of the final devices 30 with respect to the devices formed according to the prior art.

Figure 12:
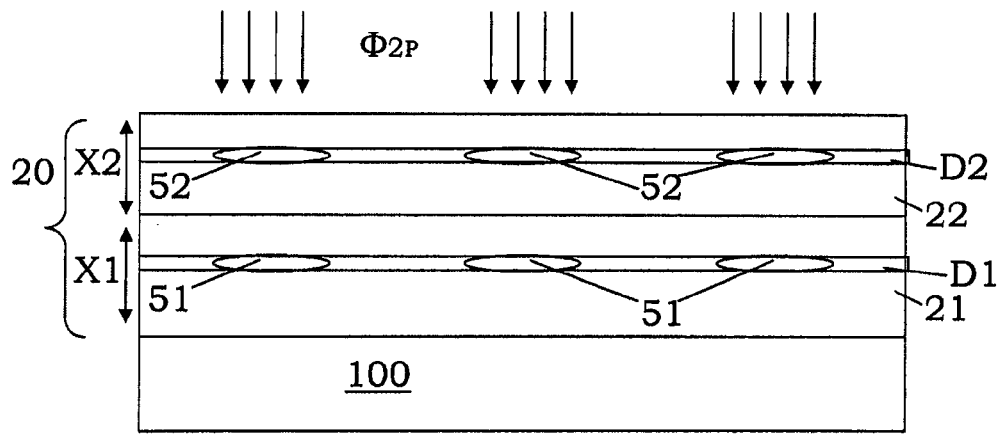

Once the second mask is removed, as shown in FIG. 12, on the first semiconductor layer 21, a second N semiconductor layer is formed with a resistivity $\rho_2$ comprised, for example, between 3 and 20 ohm*cm and a thickness X2 comprised, for example, between 1 and 10 μm, formed for example by epitaxial growth.

On the whole second semiconductor layer 22, a second N dopant implant step is carried out, to form a second N implanted region D2.

On the second semiconductor layer 22, a third mask is then formed wherein a plurality of openings are formed. Advantageously, such third mask is aligned with the second mask by means of the zero level indicator. Through these openings a second P dopant selective implant step is carried out for forming, by means of a successive diffusion process, second P implanted sub-regions 52 aligned with the first P implanted sub-regions 51.

Advantageously, also these second implant steps have the same projected range.

Advantageously, the second P dopant selective implant step is carried out with a second implant dose $\Phi_{2P}$ which is chosen so as to balance the concentration of dopant introduced through the second N dopant implant step carried out with a second dose $\Phi_{2N}$. The first P implant dose $\Phi_{2P}$ is for example comprised between $1.5 \times 10^{12}$ and $1.5 \times 10^{14}$ at/cm², the first N implant dose $\Phi_{2N}$ is for example comprised between $5.0\times10^{11}$ and $1.0\times10^{14}$ at/cm$^2$ while the implant energy used is, for example, comprised between 200 and 800 keV.

Advantageously, the resistivity of the first semiconductor layer 21 is equal to the resistivity of the second semiconductor layer 22, therefore the second implant steps use the same implant parameters of the first implant steps.

Figure 13:
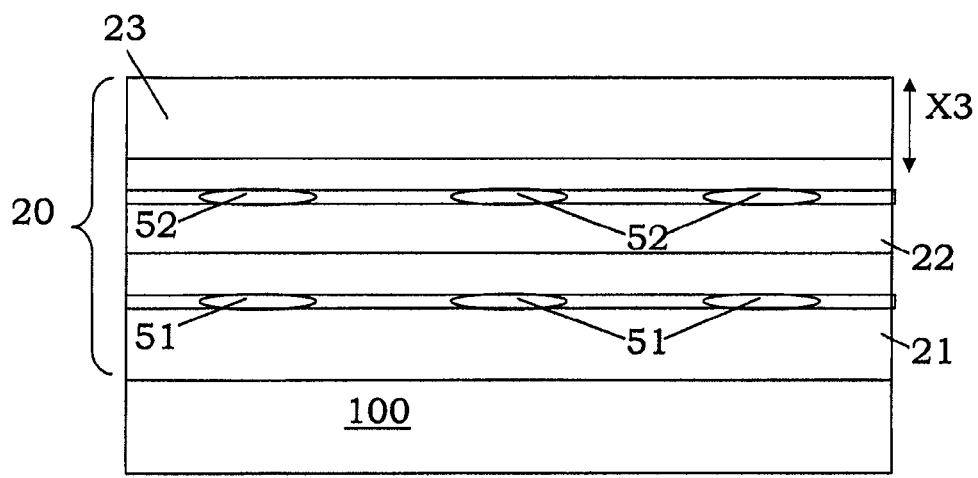

As shown in FIG. 13, as last, a third N semiconductor layer 23 is formed with a resistivity $\rho_3$ comprised, for example, between 0.15 and 7 ohm*cm and a thickness X3 comprised between, for example, 1 and 8 µm formed for example by epitaxial growth.

A fourth mask is then formed on the third epitaxial layer 23 wherein a plurality of openings are formed. Advantageously, such fourth mask is aligned with the second and with the third mask by means of the zero level indicator. Through these openings a third P+ dopant selective implant step is carried out for forming the body regions 40 of the device 30 aligned with the first sub-regions 51 and with the second sub-regions 52.

A fifth mask is then formed in a known way on the third epitaxial layer 23 wherein a further plurality of openings are formed.

Through these openings a sixth N+ dopant selective implant step is then carried out for forming source regions 60 inside body regions 40.

Figure 14:
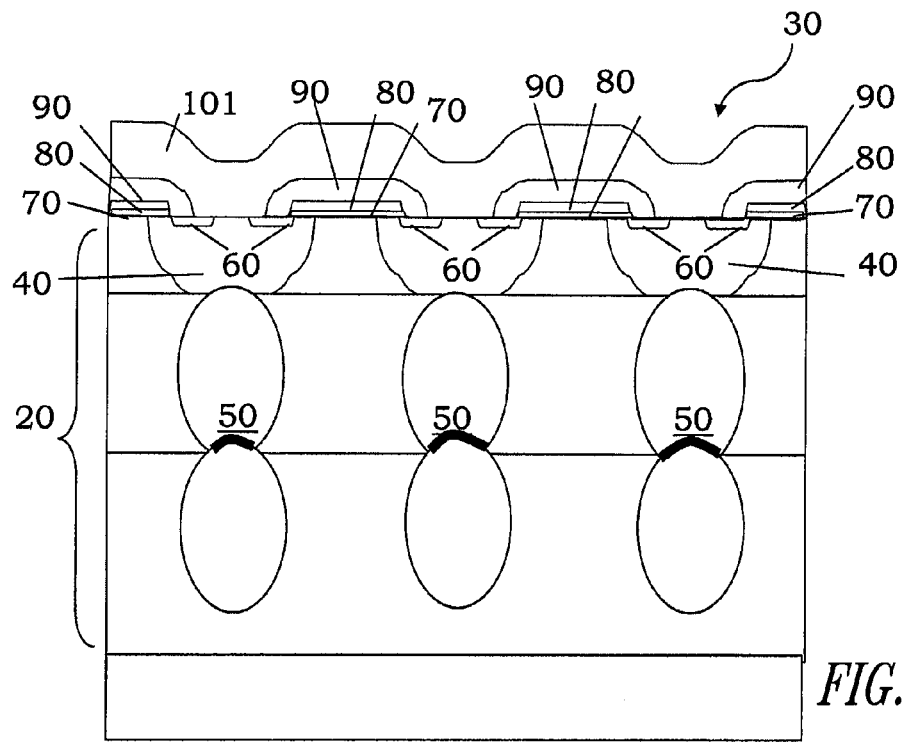

A diffusion process is then carried out for completing the sub-regions 51, 52 and the body and source regions of the device 30 so that the sub-regions 51, 52 unite to form a single electrically continuous column region 50 aligned and in electric contact with the body region 40, as shown in FIG. 14.

It is to be noted that the diffusion process realizes, in the drain semiconductor layer 20, an "anisotropic" diffusion of the P dopant of the sub-regions 51 and 52, since along the direction parallel to the surface of the drain semiconductor layer 20, the junction p/n formed by the sub-regions 51 of the P type and by the N region D1, as the one formed by the sub-regions 52 and by the region D2 is limited in the lateral diffusion by the N dopant implant carried out in the regions D1 and D2, while there is no limit to the diffusion in the direction orthogonal to the surface of the drain semiconductor layer 20.

Figure 15:
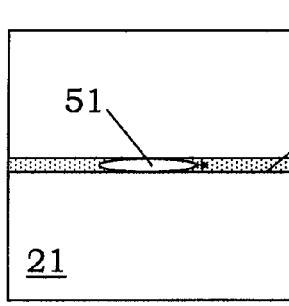
FIG. 15 shows a semiconductor substrate enlarged portion of the device of FIG. 11.
Figure 16:
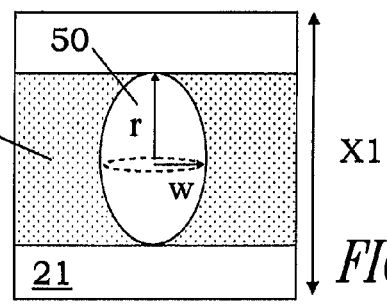
FIG. 16 shows a semiconductor substrate enlarged portion of the device of FIG. 14, FIGS. 17 and 18 respectively show a concentration profile of the P column region and of the N drain epitaxial layer for the multi-drain MOS power device of FIG. 14, FIGS. 19 to 22 show vertical sections of a multi-drain power device during some manufacturing steps of a second embodiment.

Thus, after such diffusion step, each sub-region 51, 52 of the P type takes a substantially elliptical shape wherein a first half-dimension r is much smaller than a second half-dimension w, as shown in FIGS. 15 and 16, respectively before and after the diffusion process. In particular, as shown in FIG. 16, the substantially elliptical shape of the P column region 50 is obtained because the maximum width of such P column region 50 is less the thickness of the semiconductor layer 21: 2w<X1.

Figure 17:
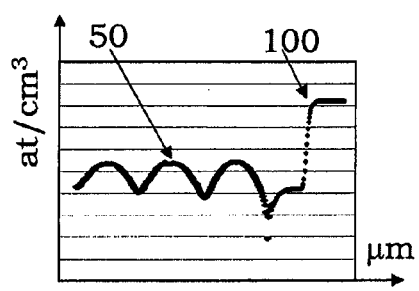
Figure 18:
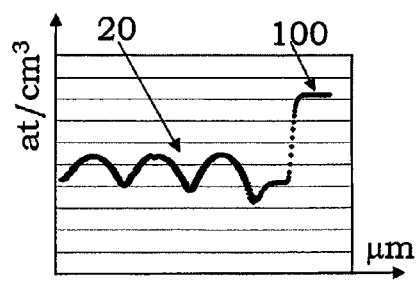
Figure 19:
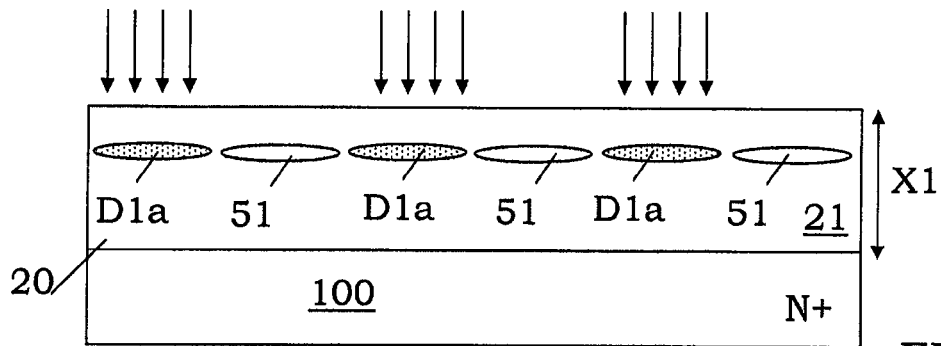

The concentration profiles both along the P column regions and along the N regions of the drain semiconductor layer 20 show a continuous back-type alternation, as respectively shown in FIGS. 17 and 18, permitting to obtain the charge balance and a high concentration of carriers in the N regions of the drain semiconductor layer 20.

Thus, the drain semiconductor layer 20 forms a drain layer common to a plurality of elementary units which form the MOS power device 30. Each elementary unit comprises a body region 40 below which there is a column region 50, which is formed by elliptical portions obtained by anisotropic diffusion of the sub-regions 51 and 52. The process is then completed with the conventional manufacturing steps providing the formation of a thin gate oxide layer 70 and of a polysilicon layer 80 on the surface of the drain semiconductor layer 20. Openings are then provided in the polysilicon layer 80 and in the thin gate oxide layer 70 until they uncover portions of the surface of the drain semiconductor layer 20 aligned with each source region 60. An insulating layer 90 is formed until it completely covers the polysilicon layer 80 and it partially covers the source regions 60, so as to allow a source metallic layer 101 formed on the device 30 to contact the source regions 60 and the body regions 40. A drain metallic layer, not shown in the figures, is finally formed on the lower surface of the semiconductor substrate 100.

With reference to FIGS. 19 to 22, a second embodiment of the process according to the invention is described.

Structurally and functionally identical elements with respect to the vertical power MOSFET transistor 30 described with reference to FIGS. 11-14 will be given the same reference numbers.

On the semiconductor substrate 100, for example of the N+ type, a drain semiconductor layer 20 is formed comprising a first N layer 21 with a resistivity $\rho_1$ comprised between 3 and 20 ohm*cm and a thickness X1 comprised between 2 and 20 µm, formed for example by epitaxial growth.

Advantageously, after having formed a first photolithographic mask on the first semiconductor layer 21, a trench is carried out in this first semiconductor layer 21 through the first photolithographic mask for forming a zero level indicator not shown in the figures.

Once the first mask is removed, on the first semiconductor layer 21a second mask is formed wherein a plurality of openings are formed. Through these openings a first P dopant selective implant step is carried out for forming, by means of a successive diffusion step, first P implanted sub-regions 51.

Once the second mask is removed, on the first semiconductor layer 21a third mask is formed wherein a plurality of openings are formed being aligned with portions of the first semiconductor layer 21 where the first P implanted sub-regions 51 have not been formed. Through these openings a first N dopant selective implant step is carried out for forming, by means of a successive diffusion step, first N implanted sub-regions D1a.

Advantageously, the masks for the P and N implant have openings being complementary to each other, but nothing forbids that they are not exactly complementary, and i.e., that for each layer the P and N sub-regions are not adjacent to each other.

Advantageously, the first P dopant selective implant step is carried out with a first implant dose $\Phi_{1P}$ which is chosen so as to balance the concentration of dopant introduced through the first N dopant selective implant step carried out with a first dose $\Phi_{1N}$. The first P implant dose $\Phi_{1P}$ is for example comprised between $5.0\times10^{12}$ and $2.0\times10^{14}$ at/cm$^2$, the first N implant dose $\Phi_{1N}$ is for example comprised between $5.0\times10^{11}$ and $5.0\times10^{13}$ at/cm$^2$.

Advantageously, both the P dopant selective implant step and the N one can be formed, each, by means of a series of implants with different energy forming a "box-like" profile with implant energy comprised between 100 and 800 keV.

In other words, each sub-region in the semiconductor layer 21 is formed by a series of implanted regions being aligned with one another and each one being formed at a different distance from the surface of the semiconductor layer 21, the distance from the surface of the semiconductor layer 21 of each implanted region depending on the implant energy.

A successive diffusion process allows these implanted regions aligned with one another to form a single electrically continuous sub-region along the epitaxial layer 21 of substantially elliptical shape.

As already highlighted with reference to the prior art, when inside the drain semiconductor layer 20 a balance condition is realized, the highest breakdown voltage BV is obtained.

In this embodiment, advantageously, the P implant and the N implant do not necessarily have to exhibit an equivalent projected range.

Figure 20:
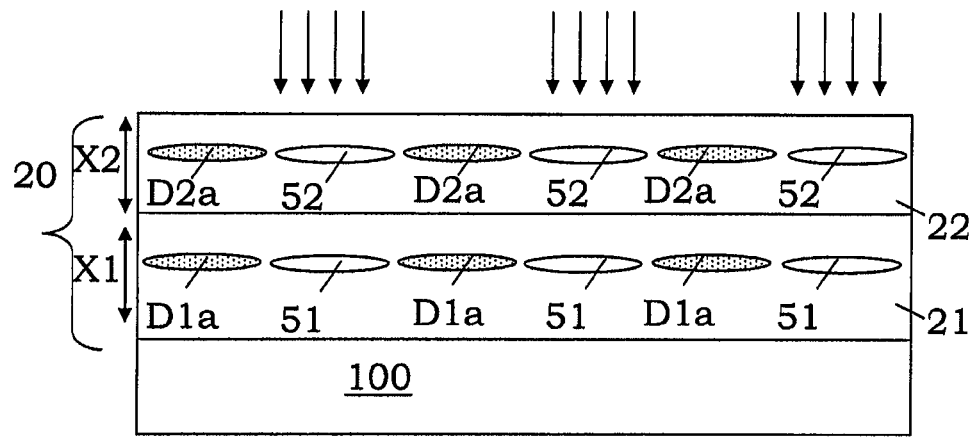

Once the third mask is removed, as shown in FIG. 20, on the first semiconductor layer 21, a second N semiconductor layer 22 is formed with a resistivity $\rho_2$ comprised between 3 and 20 ohm*cm and a thickness X2 comprised between 1 and 10 µm, formed for example by epitaxial growth.

On the second semiconductor layer 22 a fourth mask is formed wherein a plurality of openings are formed, aligned with the first P implanted sub-regions 51. Through these openings a second P dopant selective implant step is carried out for forming, by means of a successive diffusion process, second P implanted sub-regions 52, as shown in FIG. 20.

Once the fourth mask is removed, on the second semiconductor layer 22 a fifth mask is formed wherein a plurality of openings are formed being aligned with the first N implanted sub-regions D1a in the second semiconductor layer 22. Through these openings a second N dopant selective implant step is carried out for forming, by means of a successive diffusion step, second N implanted sub-regions D2a.

Advantageously, the second P dopant selective implant step is carried out with a second implant dose $\Phi_{2P}$ which is chosen so as to balance the concentration of dopant introduced through the second N dopant selective implant step carried out with a second dose $\Phi_{2N}$. The first P implant dose $\Phi_{1P}$ is for example comprised between $5.0 \times 10^{12}$ and $2.0 \times 10^{14}$ at/cm$^2$, the first N implant dose $\Phi_{1N}$ is for example comprised between $5.0 \times 10^{11}$ and $5.0 \times 10^{13}$ at/cm$^2$.

Advantageously, both the second P dopant selective implant step and the N one can be formed, each, by means of a series of implant steps with different energy forming a "cassette-like" profile with implant energy comprised between 100 and 800 keV.

Figure 21:
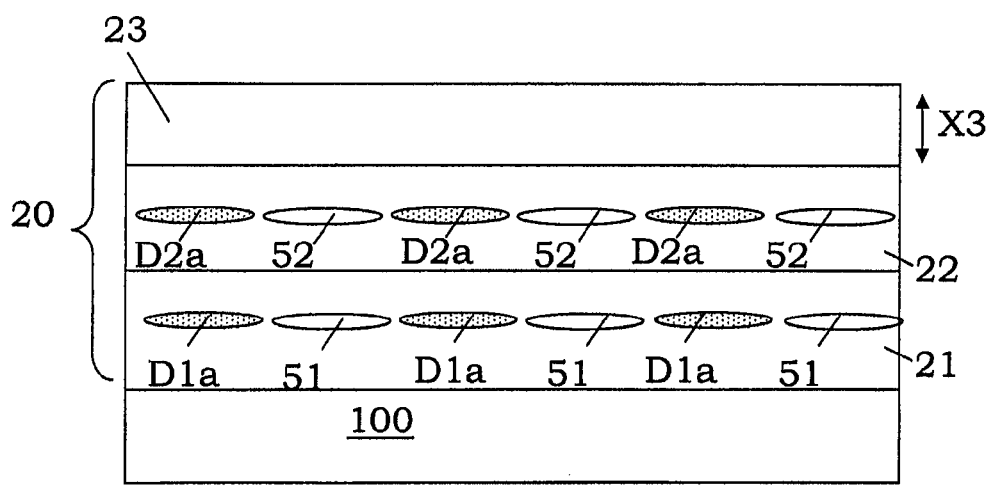

As shown in FIG. 21, as last a third N semiconductor layer 23 is formed with a resistivity $\rho_3$ comprised between 0.15 and 7 ohm*cm and a thickness X3 comprised between 1 and 8 µm, formed for example by epitaxial growth.

A sixth mask is then formed on the third epitaxial layer 23 wherein a plurality of openings are formed, aligned with first P implanted sub-regions 51. Through these openings a third N+ dopant selective implant step is then carried out for forming the body regions 40 of the device 30.

Then a seventh mask is conventionally formed on the third epitaxial layer 23 wherein a further plurality of openings are formed.

Through these openings a sixth P+ dopant selective implant step is carried out for forming source regions 60 inside the body regions 40.

Figure 22:
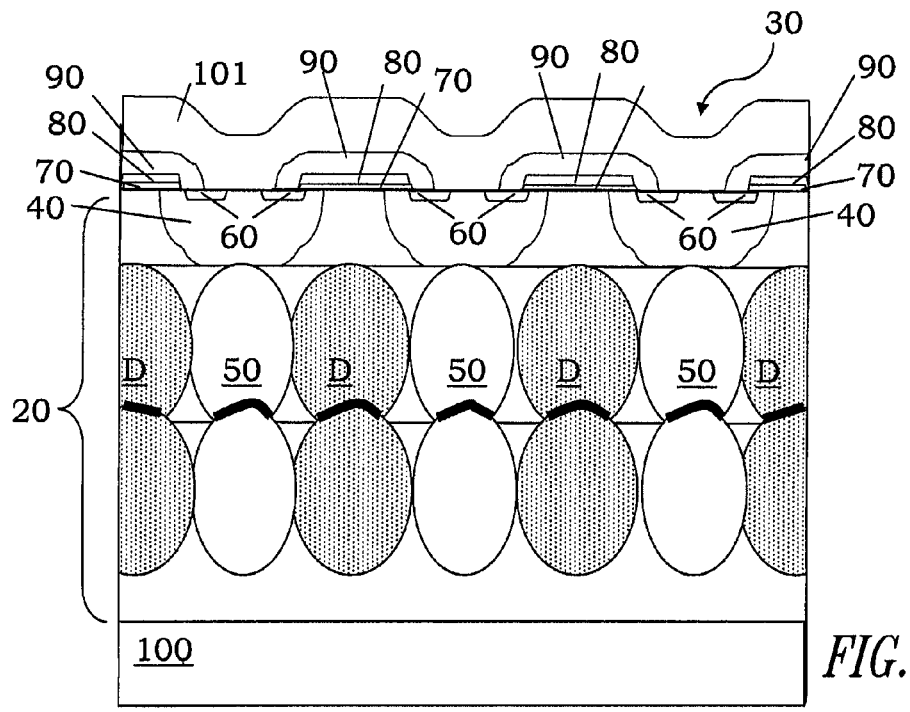

A diffusion process is then carried out for completing the sub-regions 51, 52, D1a and D2a and the body and source regions of the device 30 so that the sub-regions 51, 52 form a single electrically continuous column region 50 aligned and in electric contact with the body region 40 and the sub-regions D1a, D2a form a single electrically continuous N column region D along the drain semiconductor layer 20, as shown in FIG. 22.

In this embodiment, the diffusion process realizes in the drain semiconductor layer 20 an "anisotropic" diffusion of both the implanted P dopant and the N one for forming the sub-regions 51 and D1a, since, along the direction parallel to the surface of the device 30, the junction p/n formed by the sub-regions 51 of the P type and by the sub-regions D1 of the N type, is limited in the lateral diffusion by the simultaneous presence of high P and N concentrations, in other words they limit each other, while there is no limit in the direction orthogonal to the surface of the drain semiconductor layer 20.

Figure 23:
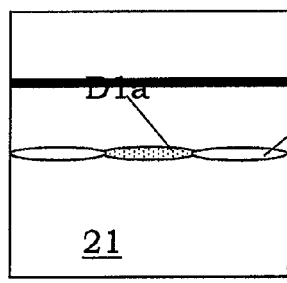
FIG. 23 shows an enlarged portion of the device of FIG. 22.
Figure 24:
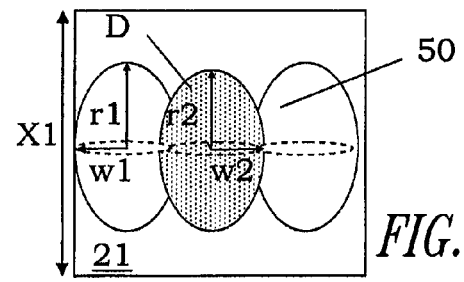
FIG. 24 shows an enlarged portion of the device of FIG. 22, FIGS. 25 and 26 respectively show a concentration profile of the P column region and of the N drain epitaxial layer for the multi-drain MOS power transistor of FIG. 12.

Thus, after such diffusion process, each P sub-region 51, 52 and each N sub-region D1a, D2a take a substantially elliptical shape wherein first half-dimensions r1 and r2 are much bigger than second half-dimensions w1 and w2, as shown in FIGS. 23 and 24 respectively before and after the diffusion step. In particular, as shown in FIG. 24, the substantially elliptical shape of the P column region 50 is obtained because the maximum width of such P column region 50 is less the thickness of the semiconductor layer 21: 2w1<X1. Advantageously, the maximum width of N column regions D is less the thickness of the semiconductor layer 21: 2w2<X1.

Figure 25:
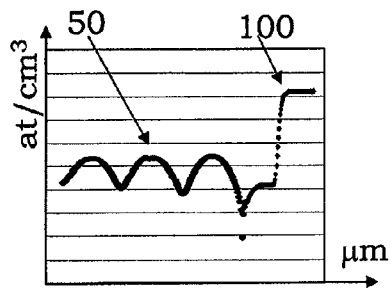
Figure 26:
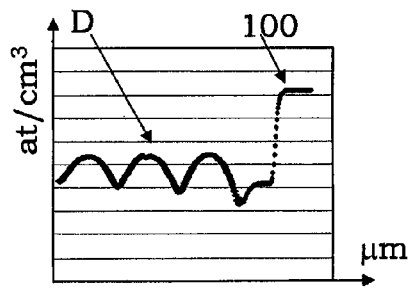

The concentration profiles both along the P column regions and along the N regions of the drain semiconductor layer 20 show a continuous back-type alternation, as shown respectively in FIGS. 25 and 26, allowing to obtain the charge balance and a high concentration of carriers in the N regions of the drain semiconductor layer 20.

Thus, the drain semiconductor layer 20 forms a drain layer common by a plurality of elementary units forming the MOS power device 30. Each elementary unit comprises a body region 40 below which there is a column region 50, which is formed by elliptical portions obtained by the "anisotropic" diffusion of the sub-regions 51, 52 of the P type. Moreover, N column regions D, also formed by elliptical portions obtained by the "anisotropic" diffusion of the sub-regions D1a, D2a of the N type, are alternated to the column regions 50 of the P type.

The process is then completed with the conventional manufacturing steps already described with reference to the previous embodiment.

Advantageously, both in the first embodiment and in the second embodiment, the second semiconductor layer 22 has a thickness X2 lower than the thickness X1 of the first semiconductor layer 21. In this way the column region 50 is spaced from the semiconductor substrate 100, so that the electric field next to the interface between the semiconductor layer 20 and the semiconductor substrate 100 is reduced. A high electric field value in this interface area in fact produces an instability of the device at the breakdown voltage BV.

In the description specific reference has been made to a drain semiconductor layer 20 comprising three epitaxial layers 21, 22, 23. However, the number of epitaxial layers used can be different. Such number of epitaxial layers in fact depends on the breakdown voltage BV the final device 30 must withstand.

Moreover, in the preferred embodiment, the resistivity of the epitaxial layers 21, 22, 23 is the same, but, advantageously, the resistivity of each single epitaxial layer forming the drain semiconductor layer 20 is different from the one of the adjacent layers so as to form stronger devices.

In conclusion, the power device 30 exhibits the following advantages:

improvement of the charge balance control inside the drain semiconductor layer 20, realization of the column regions 50 and D by means of portions having substantially "elliptical" shape, increase of the thickness X1, X2 and X3 of the single epitaxial layers forming the drain semiconductor layer 20, reduction of the number of steps for forming the drain semiconductor layer 20, and possible use of thermal processes with high thermal budget; and scaling of the power device thus formed.

Moreover, in the second embodiment, advantageously, the projected ranges of the N and P implant steps does not necessarily have to coincide.

Moreover, although in the last embodiment two masking steps for single epitaxial layer are formed, the thickness of these latter can be greater with respect to that of the ones used in the first embodiment, therefore the total thickness of the drain semiconductor layer 20 necessary for obtaining the desired breakdown voltage BV can be obtained with a lower number of epitaxial layers, thus obtaining a lower manufacturing cost and lower faultiness.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process, comprising:
   forming a drain semiconductor layer on a semiconductor substrate of a first type of conductivity;
   forming a surface semiconductor layer on the drain semiconductor layer; and
   forming body regions of a second type of conductivity in the surface semiconductor layer, the forming the drain semiconductor layer including:
     forming a first semiconductor layer of the first type of conductivity and of a first value of resistivity, the first semiconductor layer having a thickness;
     forming in the first semiconductor layer first sub-regions of the second type of conductivity using a first selective implant step with a first implant dose, the body regions being aligned with the first sub-regions;
     forming in the first semiconductor layer second sub-regions of the first type of conductivity using a second implant step with a second implant dose; and
     forming, from the first sub-regions, electrically continuous first column regions aligned and in electric contact with said body regions, respectively, the first column regions being formed by carrying out a thermal diffusion process, said first column regions being formed with a maximum width that is less than the thickness of the first semiconductor layer and being spaced apart from the semiconductor substrate, the first column regions having portions of elongated, substantially elliptical shape and having an alternating dopant concentration profile.

2. A process according to claim 1, further comprising:
   forming a second semiconductor layer of the first type of conductivity and of a second value of resistivity on said first semiconductor layer;
   forming third sub-regions of the second type of conductivity using a third selective implant step with a third implant dose, the third sub-regions being aligned with said first sub-regions; and
   forming fourth sub-regions of the first type of conductivity using a fourth implant step with a fourth implant dose, wherein, in said thermal diffusion process, said first and third sub-regions form the first column regions aligned and in electric contact with said body regions.

3. A process according to claim 2, wherein said second sub-regions form a first continuous implanted layer substantially parallel to a surface of said first semiconductor layer and said fourth sub-regions form a second continuous implanted layer substantially parallel to a surface of said second semiconductor layer.

4. A process according to claim 3 wherein said first continuous implanted layer and said first sub-regions are formed at a first distance from the surface of said first semiconductor layer and said second continuous implanted layer and said third sub-regions are formed at a second distance from the surface of said second semiconductor layer.

5. A process according to claim 3 wherein said second and fourth sub-regions are formed with a respective implant dose comprised between $5.0 \times 10^{11}$ and $1.0 \times 10^{14}$ at/cm$^2$, and said first and third sub-regions are formed with a respective implant dose comprised between $1.5 \times 10^{12}$ and $1.5 \times 10^{14}$ at/cm$^2$ and an implant energy comprised between 200 and 800 keV.

6. A process according to claim 2, wherein said second sub-regions are formed in portions of said first semiconductor layer that are free from said first sub-regions and said fourth sub-regions are formed in portions of said second semiconductor layer that are free from said third sub-regions.

7. A process according to claim 6 wherein said first and second sub-regions alternate with each other and said third and fourth sub-regions alternate with each other.

8. A process according to claim 6, wherein, in said thermal diffusion process, said second and fourth sub-regions form electrically continuous second column regions.

9. A process according to claim 6, wherein said second and fourth sub-regions are formed with at least a respective implant dose comprised between $5.0 \times 10^{11}$ and $5.0 \times 10^{13}$ at/cm$^2$, and said first and third sub-regions of the second type of conductivity are formed with at least one respective implant dose comprised between $5 \times 10^{12}$ and $2 \times 10^{14}$ at/cm$^2$.

10. A process according to claim 9, wherein each of said sub-regions is formed by a series of implant steps each carried out with a different implant energy.

11. A process according to claim 2 wherein said at least a first semiconductor layer and said at least a second semiconductor layer are formed by means of epitaxial growth and they have a same resistivity value.

12. A process according to claim 2 wherein said second semiconductor layer has a smaller thickness than said first semiconductor layer.

13. A process according to claim 1 wherein said first implant dose of the second type of conductivity balances the charge introduced with said second implant dose of the first type of conductivity.

14. A process according to claim 1 wherein a minimum distance between the first column regions is less than a thickness of the first semiconductor layer.

15. A process according to claim 1 wherein:
   forming the body regions of the second type of conductivity in the surface semiconductor layer includes implanting dopants into the surface semiconductor layer; and
   the thermal diffusion process is performed after implanting dopants into the surface semiconductor layer to form the body regions.

16. A process according to claim 1, wherein:
the drain semiconductor layer is formed on a top surface of the semiconductor substrate; and
each of the portions of the first column regions that are of elongated, substantially elliptical shape has a first dimension, in a direction perpendicular to the top surface of the semiconductor substrate, that is greater than a second dimension in a direction parallel to the top surface of the semiconductor substrate.

17. A process, comprising:
forming a semiconductor substrate of a first type of conductivity;
forming on the substrate a first semiconductor layer of the first type of conductivity and of a thickness;
forming in the first semiconductor layer implanted first sub-regions of a second type of conductivity;
forming in the first semiconductor layer implanted second sub-regions of the first type of conductivity;
forming on the first semiconductor layer a second semiconductor layer of the first type of conductivity and of a thickness;
forming in the second semiconductor layer implanted third sub-regions of the second type of conductivity;
forming in the second semiconductor layer implanted fourth sub-regions of the first type of conductivity;
forming a surface semiconductor layer;
forming body regions of the second type of conductivity in the surface semiconductor layer, the body regions being aligned with said first and third sub-regions; and
after forming the body regions, forming, from the first and third sub-regions, electrically continuous first column regions aligned and in electric contact with said body regions, respectively, the first column regions being formed with a maximum width that is less than the thickness of the first semiconductor layer and being spaced apart from the semiconductor substrate, the first column regions having portions of elongated, substantially elliptical shape and having an alternating dopant concentration profile.

18. A process according to claim 17, wherein forming said second sub-regions includes forming a continuous implanted layer substantially parallel to a surface of said first semiconductor layer, wherein the first sub-regions are formed by implanting P-type dopants in the continuous implanted layer, the implanting P-type dopants defining the second sub-regions from the continuous implanted layer dopant.

19. A process according to claim 18 wherein said continuous implanted layer is formed with a respective implant dose comprised between $5.0 \times 10^{11}$ and $1.0 \times 10^{14}$ at/cm$^2$, and said first sub-regions are formed with an implant dose comprised between $1.5 \times 10^{12}$ and $1.5 \times 10^{14}$ at/cm$^2$ and an implant energy comprised between 200 and 800 keV.

20. A process according to claim 17, wherein said second sub-regions are formed in portions of said first semiconductor layer that are free from said first sub-regions and said fourth sub-regions are formed in portions of said second semiconductor layer that are free from said third sub-regions.

21. A process according to claim 17, wherein said first column regions are formed in a thermal diffusion process that also forms electrically continuous second column regions from said second and fourth sub-regions.

22. A process according to claim 21 wherein a maximum width of said second column regions is less than the thickness of the first semiconductor layer.

23. A process according to claim 17 wherein:
forming the body regions of the second type of conductivity in the surface semiconductor layer includes implanting dopants into the surface semiconductor layer; and
forming, from the first and third sub-regions, the electrically continuous first column regions includes forming said first column regions in a thermal diffusion process after implanting dopants into the surface semiconductor layer to form the body regions.

24. A process according to claim 17, wherein:
the first semiconductor layer is formed on a top surface of the semiconductor substrate; and
each of the portions of the first column regions that are of elongated, substantially elliptical shape has a first dimension, in a direction perpendicular to the top surface of the semiconductor substrate, that is greater than a second dimension in a direction parallel to the top surface of the semiconductor substrate.

* * * * *

UNITED STATES PATENT AND TRADEMARK OFFICE
CERTIFICATE OF CORRECTION

| | | |
|---|---|---|
| PATENT NO. | : 8,012,832 B2 | Page 1 of 1 |
| APPLICATION NO. | : 11/971163 | |
| DATED | : September 6, 2011 | |
| INVENTOR(S) | : Mario Giuseppe Saggio et al. | |

It is certified that error appears in the above-identified patent and that said Letters Patent is hereby corrected as shown below:

Column 12
Line 28, "layer that are free from said first sub-regionsand said fourth" should read as
--layer that are free from said first sub-regions and said fourth--.

Signed and Sealed this
Sixth Day of December, 2011

David J. Kappos
*Director of the United States Patent and Trademark Office*